(12) United States Patent
Sasaoka et al.

(10) Patent No.: US 6,667,250 B2
(45) Date of Patent: Dec. 23, 2003

(54) FILM SUBSTRATE TREATMENT APPARATUS, FILM SUBSTRATE TREATMENT METHOD, AND FILM SUBSTRATE TRANSPORT METHOD

(75) Inventors: Tatsuo Sasaoka, Osaka (JP); Naoki Suzuki, Neyagawa (JP); Takahiro Yonezawa, Neyagawa (JP); Satoshi Horie, Kadoma (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/403,081

(22) Filed: Apr. 1, 2003

(65) Prior Publication Data

US 2003/0183339 A1 Oct. 2, 2003

(30) Foreign Application Priority Data

Apr. 2, 2002 (JP) ........................................ 2002-099637

(51) Int. Cl.[7] .............................................. H01L 21/31
(52) U.S. Cl. ...................... 438/795; 438/800; 414/935; 414/939
(58) Field of Search ................................. 438/710, 795, 438/800; 414/935, 939; 118/728; 156/345.1

(56) References Cited

U.S. PATENT DOCUMENTS

| | | | | |
|---|---|---|---|---|
| 6,048,434 A | * | 4/2000 | Tamura et al. | 156/345 |
| 6,238,160 B1 | * | 5/2001 | Hwang et al. | 414/217 |
| 6,255,223 B1 | * | 7/2001 | Matsuda et al. | 438/716 |
| 6,273,023 B1 | * | 8/2001 | Tsuchihashi et al. | 118/723 E |
| 6,354,791 B1 | * | 3/2002 | Wytman et al. | 414/744.3 |
| 6,416,618 B2 | * | 7/2002 | Tsuchihashi et al. | 156/345.51 |
| 6,544,379 B2 | * | 4/2003 | Tamura et al. | 156/345 |
| 2002/0108574 A1 | * | 8/2002 | Tamura et al. | 118/728 |
| 2003/0037882 A1 | * | 2/2003 | Arita et al. | 156/345.1 |

* cited by examiner

Primary Examiner—Alexander Ghyka
(74) Attorney, Agent, or Firm—Parkhurst & Wendel, L.L.P.

(57) ABSTRACT

To provide a film substrate treatment apparatus that appropriately mounts film substrates on an electrostatic adsorption stage. In the film substrate treatment apparatus, adsorption pads are disposed on the first adsorption units that mount film substrates on an electrostatic stage, and a pressing member that presses the edge portion areas of the film substrates against the stage is provided. The film substrates can thereby be reliably attached to the stage, and the film substrates can be appropriately treated in a decompressed atmosphere.

17 Claims, 13 Drawing Sheets

FILM SUBSTRATE TREATMENT APPARATUS, FILM SUBSTRATE TREATMENT METHOD, AND FILM SUBSTRATE TRANSPORT METHOD

BACKGROUND OF THE INVENTION

1. Field of the Invention

The present invention relates to a technique for handling film substrates when treating film substrates.

2. Description of the Related Art

In the field of packaging technology, high density packaging is required in association with miniaturization and improved high performance of electronic equipment. To achieve this, the connection of elements to a mount board has increased in minuteness, and packaging with greater reliability is required. A surface reforming method by plasma is one method of assuring reliability. For example, organic impurities adhering to the surface can be removed, the bonding strength of the wire bonding enhanced, the wettability improved, and the adhesion of sealing resin to the substrate increased with this plasma treatment. In other words, the substrate surface is activated by oxygen plasma, active oxygen and organic matter react to give a carboxyl group (—COOH), a carbonyl group (=C=O), or the like, and a surface activating effect such as improving bonding strength, is generated. A surface cleaning effect is furthermore produced by sputtering action from argon ions or oxygen ions.

In particular, when oxygen remains on the substrate surface in a flexible circuit substrate comprising film or the like, the circuit may corrode due to the effect of moisture that surrounds the substrate and electricity that flows through the circuit, so chlorine adhering to the surface is removed by plasma treatment. The adhesion of resin and the substrate is also improved and the penetration of moisture from the exterior is prevented.

The conventional configuration of such plasma treatment is typified by manually performing a series of operations one step at a time by mounting several films in the chamber, closing the chamber lid, performing rough vacuum and main vacuuming, opening the gas valve, applying high-frequency power, stopping application of high-frequency power, restoring atmospheric pressure, and opening the chamber. Vacuum pressure is confirmed by a vacuum gauge, and the time high-frequency power is applied is measured with a stop watch.

However, the throughput is limited with the configuration described above because batch treatment becomes inevitable. In addition, the film is manually inserted and removed, and can therefore be contaminated. Film management is furthermore difficult due to time gap between cleaning and the following process.

SUMMARY OF THE INVENTION

In view of the above, a principal object of the present invention is to provide a technique for mounting and treating a film on an electrostatic stage, and automating the process.

The first invention is a film substrate treatment apparatus that comprises: a stage for holding a rear surface of the film substrate by electrostatic force, the rear surface being opposite to a to-be-treated surface of the film substrate; a chamber for accommodating the stage in an interior thereof; a treatment unit for performing a predetermined treatment on the to-be-treated surface of the film substrate held by the stage, with the interior of the chamber in a decompressed state; and a transport unit for transporting a film substrate while holding the to-be-treated surface thereof, and mounting the film substrate on the stage while pressing the to-be-treated surface thereof against the stage.

The second invention is the film substrate treatment apparatus according to the first invention, wherein the transport unit has a carrying-in holding unit that holds the film substrate by suction.

The third invention is the film substrate treatment apparatus of the first or second invention, wherein the carrying-in holding unit has a pressing member for pressing at least an edge portion area of the film substrate against the stage.

The fourth invention is the film substrate treatment apparatus of the first or second invention, wherein the carrying-in holding unit has a surface for pressing an entire peripheral portion of the film substrate against the stage.

The fifth invention is a film substrate treatment method that comprises: a transport step for transporting a film substrate while holding a to-be-treated surface of the film substrate by a carrying-in holding unit; a mounting step for mounting the film substrate on a stage while pressing the to-be-treated surface of the film substrate against the stage by the carrying-in holding unit; a stage holding step for holding a rear surface of the film substrate on the stage by electrostatic force, the rear surface being opposite to the to-be-treated surface; a decompressing step for reducing pressure in an area surrounding the stage; and a treatment unit step for performing a predetermined treatment on the to-be-treated surface of the film substrate.

The sixth invention is the film substrate treatment method according to the fifth invention, wherein the carrying-in holding unit presses at least the edge portion area of the film substrate against the stage in the mounting step.

The seventh invention is the film substrate treatment method according to the fifth invention, wherein the carrying-in holding unit presses the entire peripheral portion of the film substrate against the stage in the mounting step.

The eighth invention is the film substrate treatment method according to any one of the fifth to seventh inventions, wherein the stage holding step has a step for applying voltage to the stage, and a step for releasing the hold of the film substrate by the carrying-in holding unit after changing the voltage.

The ninth invention is the film substrate treatment method according to any one of the fifth to seventh inventions, wherein the stage holding step has a step for applying voltage to the stage, a current detecting step for detecting current to the stage and detecting a drop in current after applying the voltage, and a releasing step for releasing the hold of the film substrate by the carrying-in holding unit after detecting a drop in the current.

The tenth invention is a film substrate treatment apparatus having a carrying-out holding unit for dismounting a film substrate from a stage that holds the film substrate by electrostatic force, wherein the carrying-out holding unit comprises an edge lifting unit for holding and lifting an edge of the film substrate from the stage, and a complete separation unit for holding other parts of the film substrate and separating the entire film substrate from the stage.

The eleventh invention is the film substrate treatment apparatus according to the tenth invention, wherein the edge lifting unit comes into contact with the film substrate and is a part of a circular arc surface for sucking, and the complete separation unit is another part of the circular arc surface.

The twelfth invention is a film substrate treatment method for dismounting a film substrate from a stage for holding the film substrate, the film substrate treatment method comprising a holding step in which an edge lifting unit holds an edge of the film substrate on the stage, and a complete separation unit holds other parts; an edge lifting step in which the edge lifting unit lifts the edge of the film substrate from the stage by providing a clearance from the stage; and a complete separation step in which the complete separation unit completely separates the entire film substrate from the stage by providing a clearance from the stage.

The thirteenth invention is the film substrate dismounting method according to the twelfth invention, wherein the stage folds the film substrate by electrostatic force, and the method further comprises a voltage terminating step for terminating voltage applied to the stage, before the edge portion lifting step, and a voltage detection step for detecting change in voltage of the stage.

The fourteenth invention is the film substrate dismounting method according to the thirteenth invention, further comprising a reverse voltage applying step for providing reverse voltage to the stage, before the voltage terminating step.

The fifteenth invention is a film substrate treatment apparatus comprising a transport unit for transporting film substrates, a stage for holding a rear surface of the film substrate of the film substrate by electrostatic force, the rear surface being opposite to a to-be-treated surface of the film substrate, a chamber for accommodating the stage in an interior thereof, and a treatment unit for performing a predetermined treatment on the to-be-treated surface of the film substrate held by the stage, with the interior of the chamber in a decompressed state, wherein the transport unit comprises a carrying-in holding unit for holding and transporting the film substrates, and mounting the film substrate on the stage while pressing the to-be-treated surface of the film substrate, and a carrying-out holding unit for dismounting the film substrates from the stage that is holding the film substrate by electrostatic force.

The sixteenth invention is the film substrate treatment apparatus according to the fifteenth invention, wherein the carrying-out holding unit holds the film substrate by suction, and presses the edge portion area of the film substrate against the stage.

The seventeenth invention is the film substrate treatment apparatus according to the fifteenth invention, wherein the carrying-out holding unit first holds the edge portion of the film substrate and thereafter lifts the entire film substrate from the stage.

According to the film substrate treatment apparatus and method related to the present invention according to the configuration described above, a film substrate can be reliably held on a stage when the film substrate is processed in a decompressed atmosphere. According to the film substrate treatment apparatus and the film substrate dismounting method related to the present invention, the film substrate can be received from the stage holding the film substrate by electrostatic force, without application of excessive force.

DESCRIPTION OF THE PREFERRED EMBODIMENTS

The embodiments related to the present invention are described below in detail based on the diagrams.

Figure 1A:
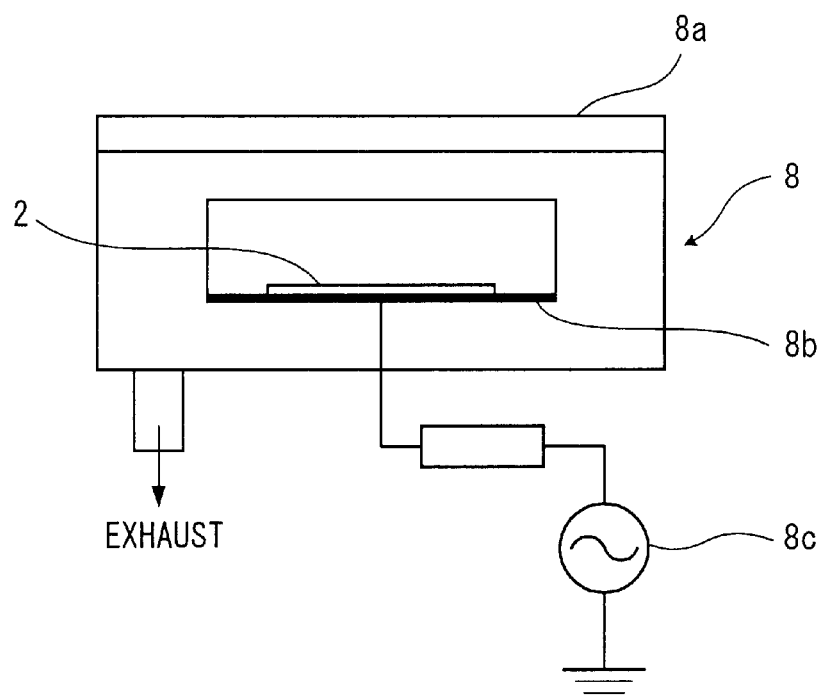
FIG. 1A is a schematic diagram showing a configuration of a chamber.
Figure 1B:
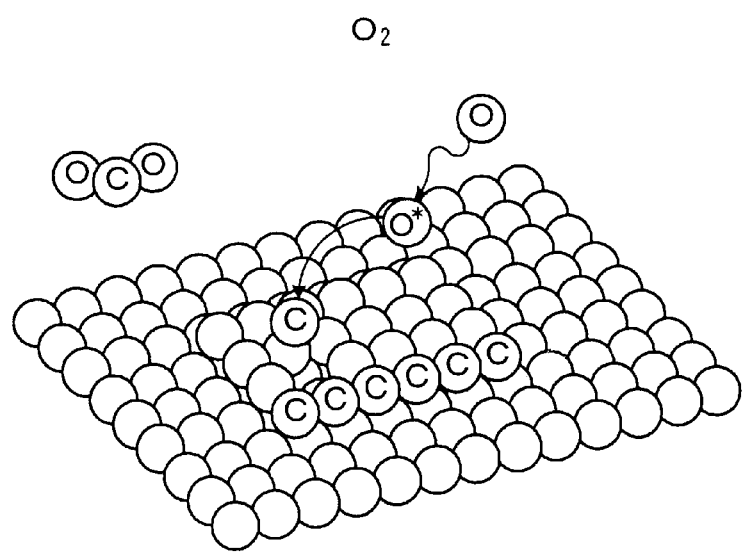
FIG. 1B is an explanatory diagram showing a basic principle of substrate treatment by plasma.

FIG. 1A shows the chamber of the film substrate treatment apparatus, and FIG. 1B is an explanatory diagram describing the basic principles of treatment by plasma.

The film substrate 2 of the present embodiments has a thickness of 0.5 mm to 0.05 mm, and a wiring pattern is formed on the flexible insulating film by a metal thin film. The insulating film is a composite resin composed of PET, polyimide, PPS or the like. It is apparent that the present invention is not limited to this type of film substrate 2.

First, the basic principles of the plasma treatment device of the present invention will be described. A stage 8b having electrodes is disposed inside the chamber 8 shown in FIG. 1A, and a circuit substrate such as film substrate 2 is automatically received on the stage 8b. With the interior of the chamber 8 evacuated, a reactive gas introduced to the interior of the chamber 8, and a predetermined decompressed state maintained, a high-frequency power (however, the treatment time is varied) of 100 W to 500 W is applied from a high-frequency power supply 8c, and an oxygen plasma is generated inside the chamber 8. As shown in FIG. 1B, when the surface of the substrate 2 held on the stage 8b is treated by the generated oxygen plasma, the carbon atoms of organic matter on the surface of the substrate 2 and the ionized oxygen react to give a carbon dioxide phase, which is then evacuated from an exhaust port in the lower portion. Because of this, the organic matter from the surface of the substrate 2 is automatically removed. In this manner, the surface of the bonding portions of substrate electrodes or other components for bonding IC chips and other components is activated, and bonding strength can be enhanced.

Figure 2:
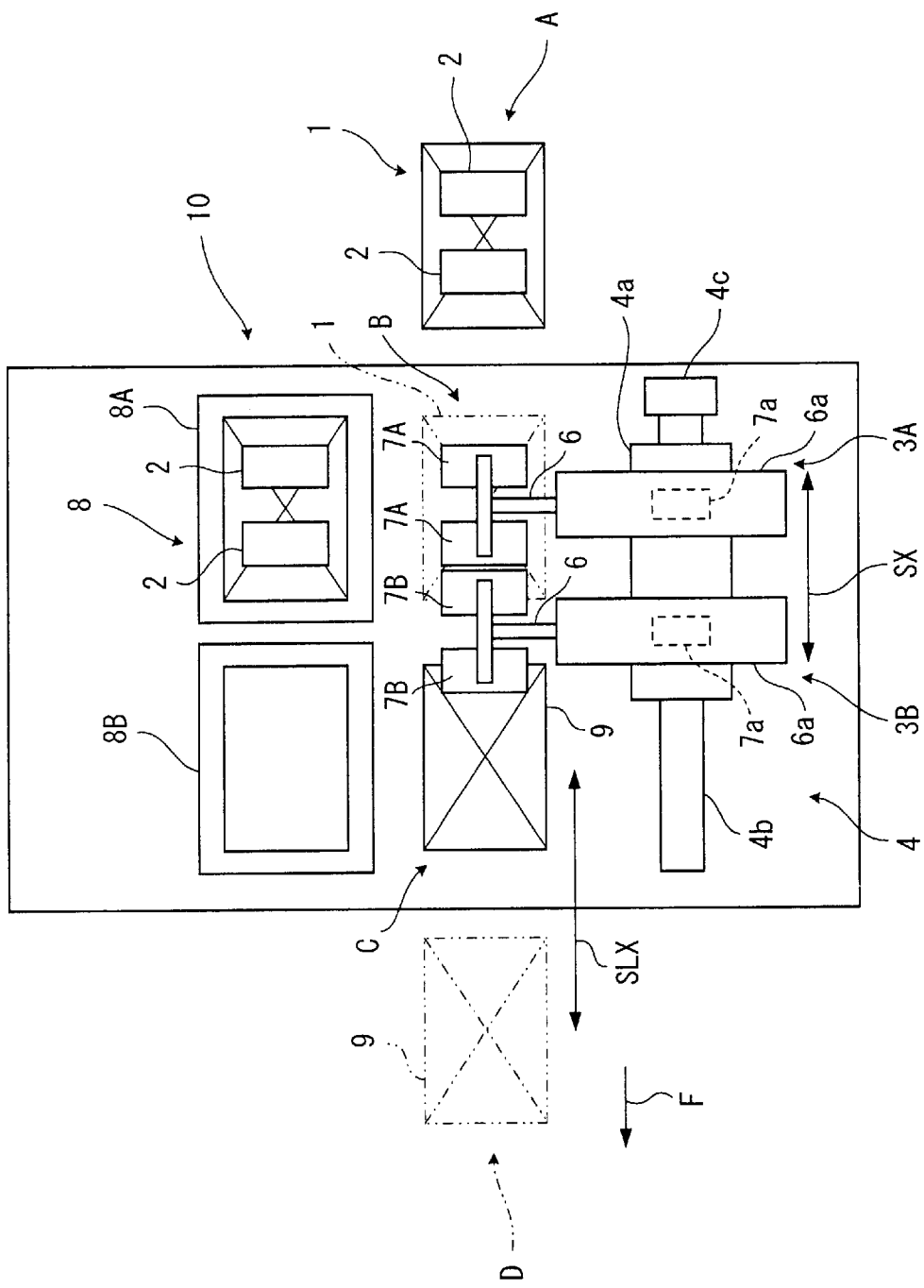
FIG. 2 is a plan showing a film substrate treatment apparatus.

A specific film substrate treatment apparatus is subsequently described. As shown in FIG. 2, the film substrate treatment apparatus comprises a substrate receiving slider 1 that carries a pair of film substrates 2 to the interior of a film substrate treatment apparatus main unit 10 from the exterior of the film substrate treatment apparatus main unit 10; a pair of transport arm devices (carrying-in holding unit, and a portion of the carrying-out holding unit) 3A and 3B for holding by adsorption and moving a pair of film substrates 2 from the substrate receiving slider 1; a moving device 4, with the pair of transport arm devices 3A and 3B fixed thereto and supported thereby, for moving the pair of transport arm devices 3A and 3B along F in the substrate transport direction (the left direction of FIG. 2); a plasma treatment chamber 8 comprising a first chamber for treating the pair of film substrates 2 by plasma and a second chamber 8B for treating the pair of film substrates 2 by plasma; and a substrate transport slider 9 for holding and dismounting the pair of film substrates 2 from the interior of the film substrate treatment apparatus main unit 10 to the exterior of the film substrate treatment apparatus main unit 10.

The substrate receiving slider 1 is moved between a substrate receiving preparation position A outside the film substrate treatment apparatus main unit 10 and a substrate receiving position B inside the film substrate treatment apparatus main unit 10 by the driving of a motor, air cylinder, or other drive device while the pair of film substrates 2 is held by adsorption.

The moving device 4 is configured so that the pair of transport arm devices 3A and 3B is affixed onto and supported by a moving body 4a. The moving body 4a can be moved back and forth in the substrate transport direction F along a guide member 4b by a servomotor 4c or other drive device.

The pair of transport arm devices 3A and 3B each comprise a motor or other arm unit drive device 6a affixed to the moving body 4a, and an arm unit 6 for moving in the axial direction (the direction orthogonal to the substrate transport direction F) by driving the arm unit drive device 6a. The transport arm device 3A has a pair of first adsorption units 7A at the tip of the arm unit 6, and the transport arm device 3B has a pair of second adsorption units 7B at the tip of the arm unit 6. The first adsorption units 7A and the second adsorption units 7B can be moved up and down by the adsorption unit elevator device 7a. The first adsorption units 7A and the second adsorption units 7B are lowered to the lower edge position, and the pair of film substrates 2 can be simultaneously attached and held by the operation of a suction device (not depicted). The pair of first adsorption units 7A or second adsorption units 7B can furthermore be moved by the driving of the arm unit driving device 6a between the chambers 8 and the substrate dismounting slider 9 or the substrate receiving slider 1 positioned in the vicinity of the moving body 4a. The configuration allows a pair of film substrates 2 to be simultaneously transferred between both devices.

One (the right side in FIG. 2, in other words, the side proximate to the substrate receiving side) of the transport arm devices 3A is a transport arm device for receiving the film substrates 2 in the chambers 8A and 8B. The other (the left side in FIG. 2, in other words, the side proximate to the substrate dismounting side) of the transport arm devices 3B is a transport arm device for dismounting the film substrates 2 from the chambers 8A and 8B. The respective transport arm devices therefore always attach to the film substrates 2 before treating by plasma or to the film substrates 2 after treating by plasma, and because the film substrates 2 in both states of before and after treating by plasma are not attached to with the same transport arm devices, contamination due to adsorption can be eliminated.

While holding the pair of film substrates 2 by adsorption, the substrate dismounting slider 9 is moved by the driving of a motor, air cylinder, or other driving device between a substrate dismounting position C inside the film substrate treatment apparatus main unit 10 and a substrate dismounting preparation position D outside of the film substrate treatment apparatus main unit 10. It should be noted that the method of holding a pair of film substrates 2 is not limited to adsorption, but an engagement member or other means may be used.

Treatment by plasma may be carried out independently in each the first chamber 8A and the second chamber 8B. Thus, when, for example, plasma treatment is performed in one chamber, the film substrates 2 for which treatment by plasma has been completed in the other chamber may be dismounted, and film substrates 2 to be subsequently treated by plasma may be received. The receiving and dismounting of the film substrates 2 to and from the chambers 8 is performed with lids 8a shown in FIG. 1 (or the hereinafter described FIG. 3) open, and the lids 8a are each opened and closed by the driving of an air cylinder for opening and closing the lids.

Figure 3:
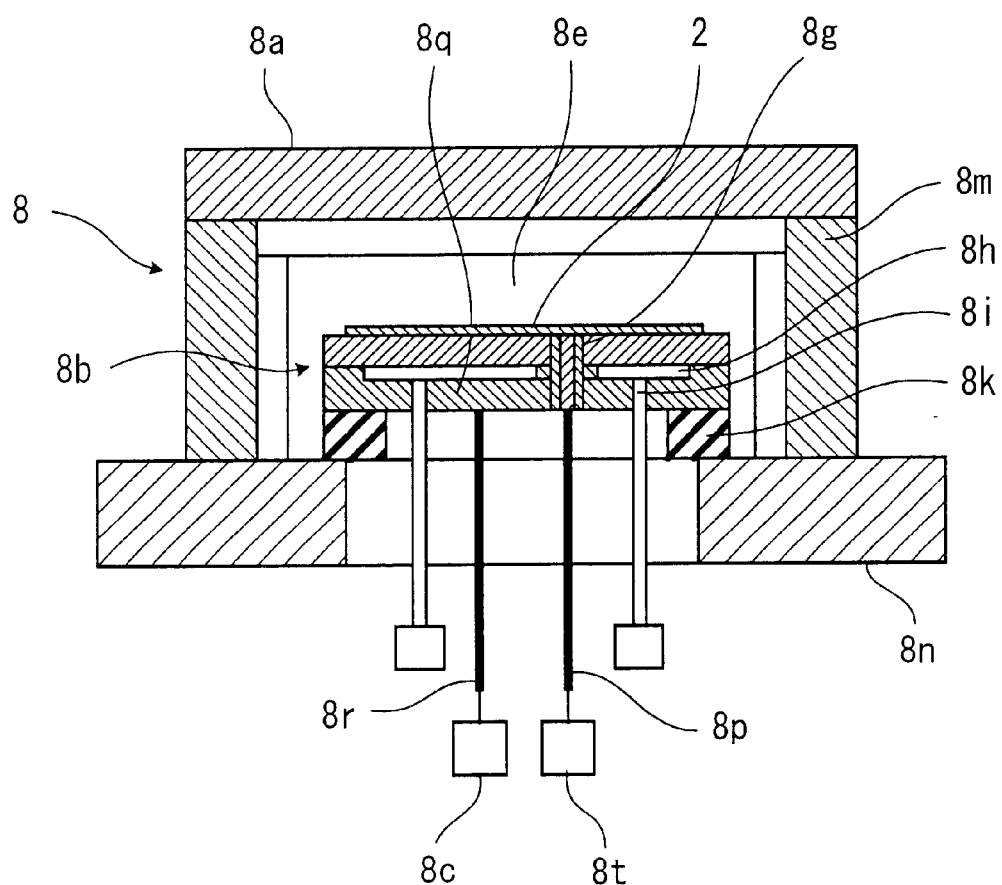
FIG. 3 is a longitudinal section showing the chamber.

The first chamber 8A and the second chamber 8B have the same configuration, and the chamber 8 is shown in FIG. 3. In FIG. 3, 8a is the lid of chamber 8 that opens and closes by sliding in the vertical direction, 8e is a quartz cover disposed on the inner surface of the side wall of chamber 8, 8g is an insulating material for insulating the DC electrode used for substrate electrostatic adsorption and for insulating the stage 8b to which high-frequency power is applied, 8h is a cooling water channel for cooling the stage 8b, 8i is a cooling water pipe for supplying cooling water to the cooling water channel, 8k is an insulator comprising alumina or other material for insulating the stage 8b and the chamber 8, 8m is a side wall of chamber 8 comprising stainless steel SUS304 or other material, 8n is a base of chamber 8 comprising stainless steel SUS304 or other material, 8p is a DC electrode for substrate electrostatic adsorption connected to a DC power supply 8t for substrate electrostatic adsorption, 8q is a water-cooling jacket comprising SUS304 or other material for forming the cooling water channel of the stage 8b, and 8r is a high-frequency applied electrode connected to a high-frequency power supply 8c.

Note that the side wall 8m, the lid 8a, and the base 8n of the chamber 8 are grounded. When the film substrates 2 are therefore mounted on the stage 8b inside the chambers 8, a DC voltage is applied from the DC power supply 8t for substrate electrostatic adsorption to the DC electrode 8p for substrate electrostatic adsorption, and the film substrates 2 are held to the stage 8b by an electrostatic adsorption effect. During treatment by plasma, the film substrates 2 are held in such a state of electrostatic adsorption. When removing after completing plasma treatment, the application of DC voltage to the DC electrode 8p for substrate electrostatic adsorption is stopped or a reverse voltage is allowed to operate to facilitate the removal of the film substrates 2 from the stage 8b.

Figure 4:
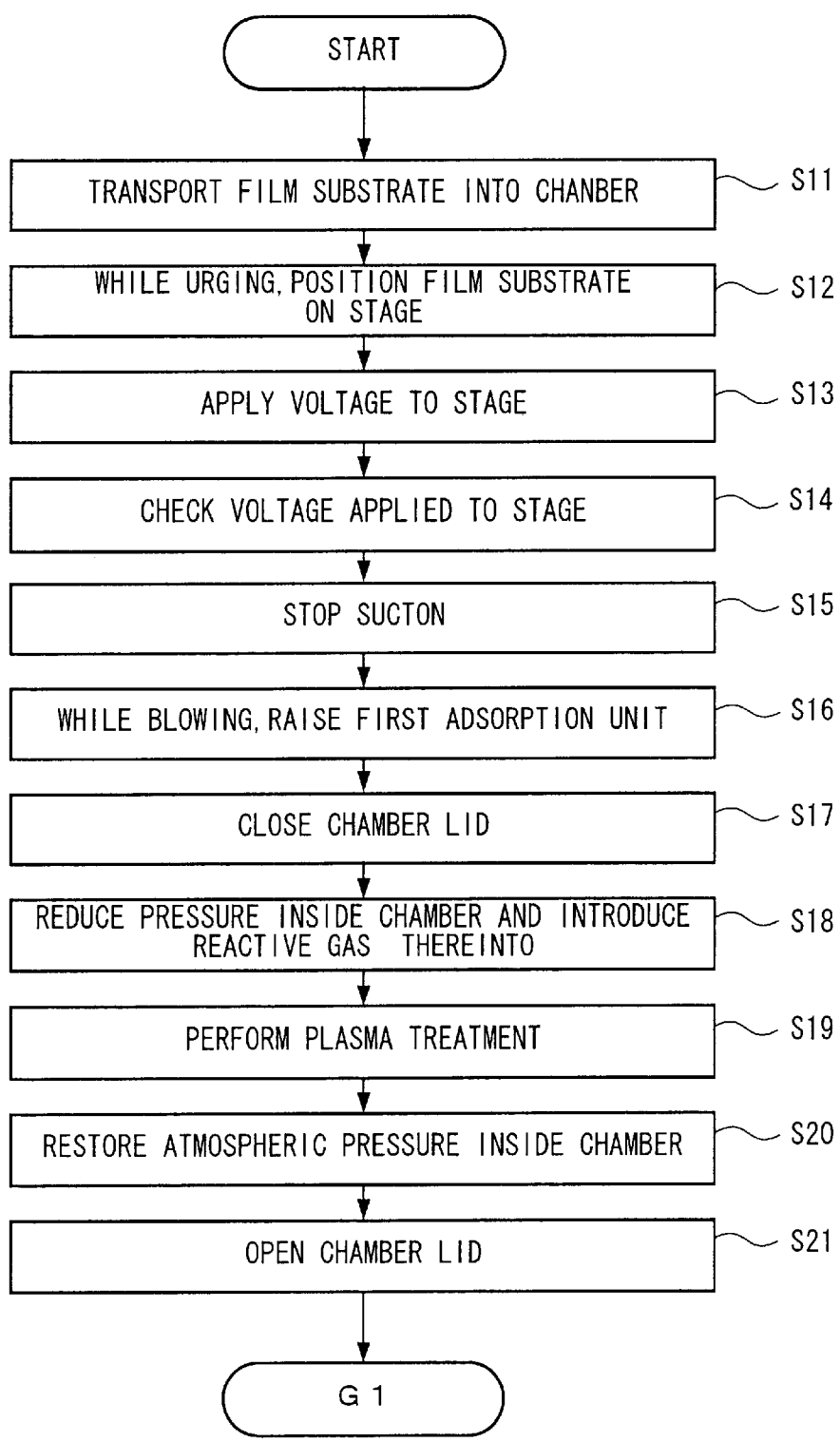
FIG. 4 is a flowchart showing an operation flow of the film substrate treatment apparatus.
Figure 5:
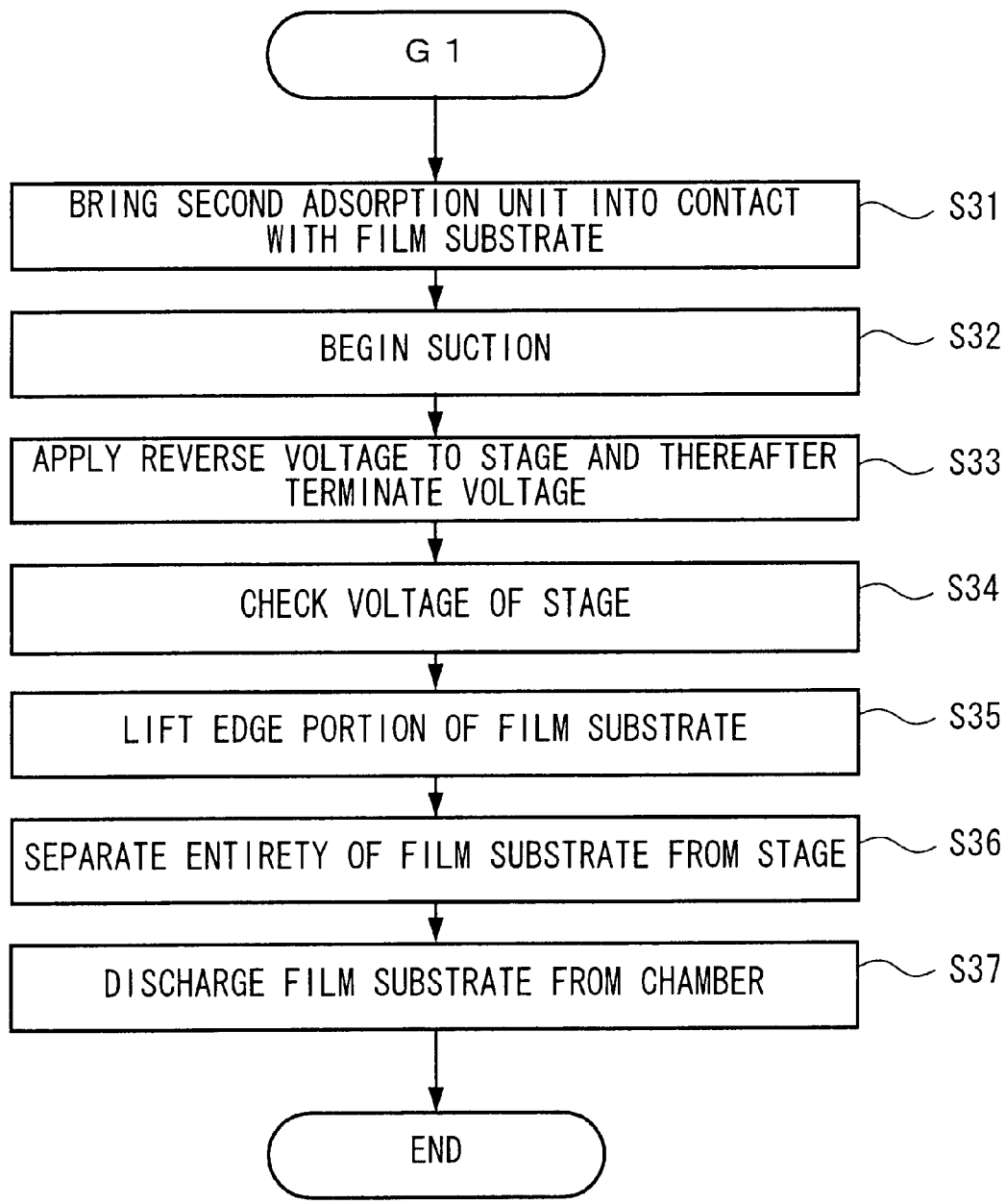
FIG. 5 is a flowchart showing the operation flow of the film substrate treatment apparatus.

FIGS. 4 and 5 are flowcharts that depict the operation flow of the film substrate treatment apparatus related to one of the chambers 8 (first chamber 8A or second chamber 8B).

The substrate receiving slider 1 for holding a pair of film substrates 2 is moved from the substrate receiving preparation position A to the substrate receiving position B (refer to FIG. 2). The moving device 4 positions each of the pair of first adsorption units 7A of the transport arm device 3A over the film substrates 2. The adsorption unit elevator device 7a lowers the first adsorption units 7A to be brought into contact with the film substrates 2, and suction begins through the suction holes formed in the first adsorption units 7A. In this manner, the first adsorption units 7A attach by suction to the film substrates 2 from the to-be-treated surface side.

The first adsorption units 7A subsequently rise by way of the adsorption unit elevator device 7a, and the arm unit drive device 6a moves the arm unit 6 to the chamber 8 side and transports (step S11) the film substrates 2 to the chamber 8 interior while holding them from the to-be-treated surface side. The pair of first adsorption units 7A are lowered inside of chamber 8 with the adsorption unit elevator device 7a, and the film substrates 2 are transferred (steps S12 to S16) to the stage 8b. The manner in which film substrates 2 are transferred from the first adsorption units 7A to the stage 8b is described in greater detail below.

Figure 6:
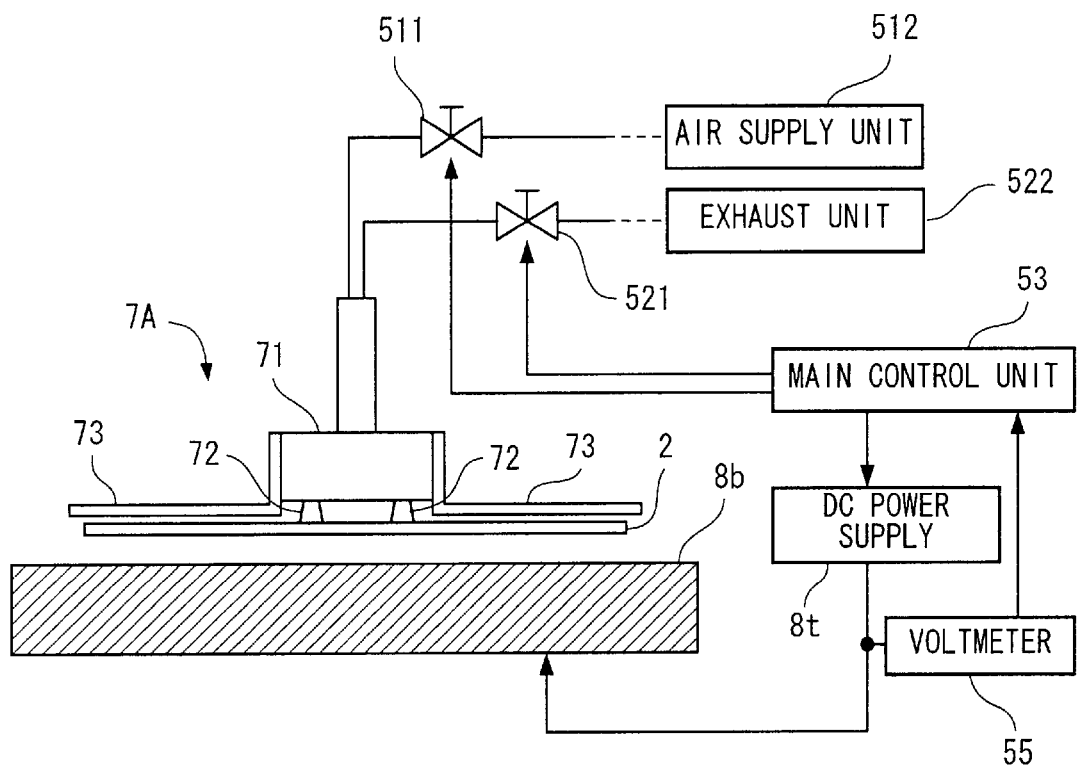
FIG. 6 is a front view showing a first adsorption unit.
Figure 7:
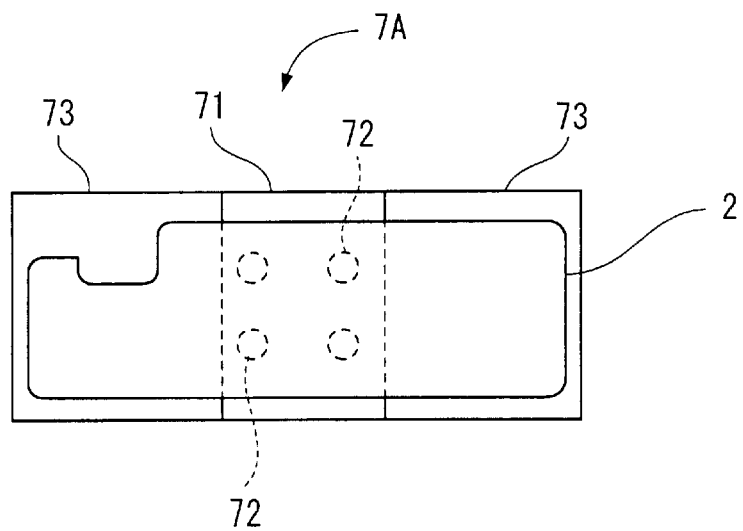
FIG. 7 is a bottom view showing the first adsorption unit with a film substrate sucked thereto.

FIG. 6 is a diagram that depicts the configuration of the first adsorption units 7A and the state prior to receiving film substrates 2 between the first adsorption units 7A and the stage 8b, and FIG. 7 is a bottom view of the first adsorption units 7A with film substrates 2 attached thereto. In the first adsorption units 7A, adsorption pads 72 composed of elastic bodies comprising suction holes are attached to the lower surface of a main body block 71, and two pressing members 73 are attached along the lengthwise direction of the film substrate 2. The pressing members 73 are formed of stainless steel, for example. The lower edge of the adsorption pads 72 protrude slightly downward from the lower surface of the pressing members 73, and with the adsorption pads 72 attached to the film substrates 2, a slight space exists between the lower surface of the pressing members 73 and the film substrates 2.

The suction holes of the adsorption pads 72 are connected to two pipes by way of the passage inside the main body block 71, one pipe is connected to an air supply unit 512 by way of a valve 511, and the other pipe is connected to an exhaust unit 522 by way of a valve 521. The opening and closing of the two valves 511 and 521 are electrically controlled by a main control unit 53. The main control unit 53 also controls the DC power supply 8t connected to the stage 8b for electrostatic adsorption by the stage 8b, voltage provided to the stage 8b by the DC power supply 8t is measured by the voltmeter 55, and the measured value is inputted to the main control unit 53.

Figure 8:
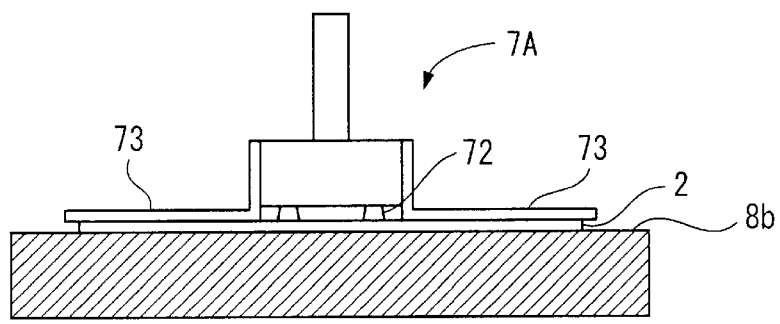
FIG. 8 is an explanatory diagram showing how the first adsorption unit transfers a film substrate to a stage.
Figure 9:
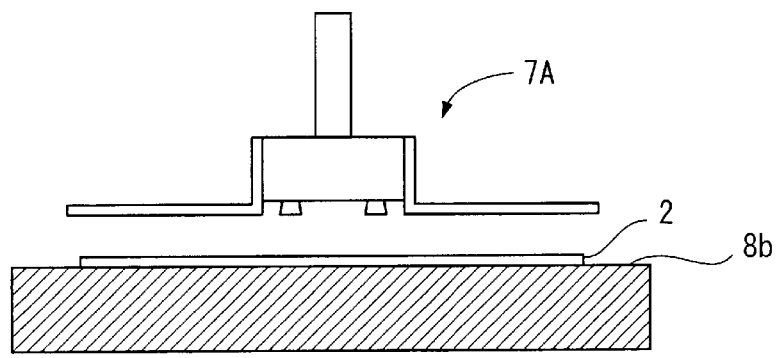
FIG. 9 is an explanatory diagram showing how the first adsorption unit transfers the film substrate to the stage.
Figure 10:
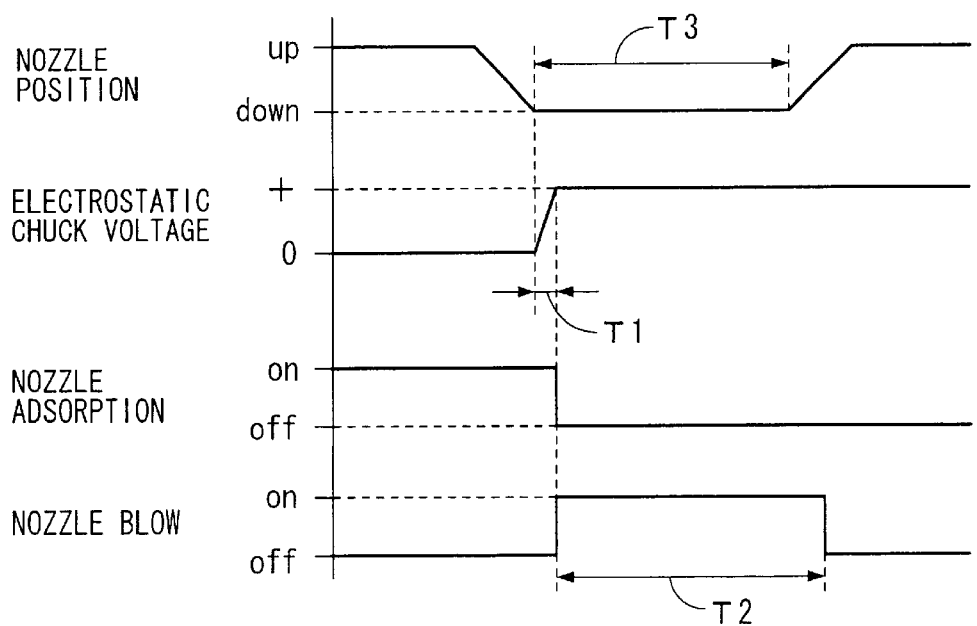
FIG. 10 is a timing chart for the process in which the first adsorption unit transfers the film substrate to the stage.

FIGS. 8 and 9 are diagrams that depict the manner in which the first adsorption units 7A mounts the film substrates 2 on the stage 8b from the state depicted in FIG. 7, and FIG. 10 is a timing chart depicting this process. When the film substrates 2 are mounted on the stage 8b while being held from the to-be-treated surface side by the first adsorption units 7A, the adsorption pads 72 come into contact with the stage 8b and elastically deform as shown in FIG. 8. The space between the lower surface of pressing members 73 and the film substrates 2 is thereby eliminated, and the pressing members 73 press the edge portion in the lengthwise direction of the film substrates 2 toward the stage 8b side (FIG. 4: step S12)

When the first adsorption units 7A (nozzles) are sufficiently lowered, a voltage (2 kV to 3 kV) for electrostatic adsorption (electrostatic chuck) is provided (step S13) to the stage 8b by the DC power supply 8t, as shown in FIG. 10. When a predetermined length of time T1 (0.1 seconds to 0.3 seconds) passes and a stable voltage based on the measured value from the voltmeter 55 as shown FIG. 6 is confirmed (step S14), the valve 521 is closed, suction by the first adsorption units 7A is stopped, and the hold on the film substrates 2 is released (step S15). The valve 511 is opened, and compressed air from the air supply unit 512 is expelled from the adsorption pads 72 and blown toward the film substrates 2. Blowing is maintained during the interval of blow time T2 (0.1 seconds to 0.5 seconds); the lower limit maintaining time T3 (normally, T3=T1+T2), during which the first adsorption units 7A are positioned at the lower limit, passes just before blowing is completed; and the first adsorption unit 7A leaves the film substrates 2 on the stage 8b and rises (step S16) as shown in FIG. 9.

As described above, when the film substrates 2 are transferred to the stage 8b, an excessive force is not applied to the film substrates 2, and the film substrates 2 are smoothly transferred to the stage 8b from the first adsorption unit 7A because the film substrates 2 are mounted on the stage 8b while the edge portion area of the film substrates 2 is pressed from the to-be-treated surface side by the pressing members 73, and because the stage 8b reliably holds the reverse side, which is the opposite side of the to-be-treated surface. It should be noted that because the first adsorption units 7A attach by suction to the film substrates 2, the film substrates 2 can easily be received inside the chambers 8 under atmospheric pressure.

When the film substrates 2 are transferred to the stage 8b, the pair of first adsorption units 7A is positioned outside the chambers 8 by the arm unit drive device 6a as shown in FIG. 2, and the lids 8a of the chambers 8 are closed (step S17). The interior of chambers 8 are evacuated and the pressure is reduced (about 0.1 P to 1 P); argon, oxygen, or other reactive gas is introduced at 5 cc to 20 cc/min; a high-frequency power of 100 W to 500 W is applied to the stage 8b for an interval of 5 to 30 seconds; and plasma is generated inside the chambers 8 (step S19). The pressure inside the chambers 8 reaches 1 P to 50 P. Processes such as washing, reforming, and the like are thereby performed by plasma on the to-be-treated surface of the film substrates 2.

When treatment by plasma is complete, the interior of chambers 8 is returned to atmospheric pressure, the lids 8a of the chambers 8 are opened (steps S20 and S21), and the second adsorption units 7B of the transport arm device 3B is moved into the chambers 8 by the arm unit drive device 6a. The film substrates 2 are thereafter transferred between the stage 8b and the second adsorption units 7B (FIG. 5: steps S31 to S36).

Figure 11:
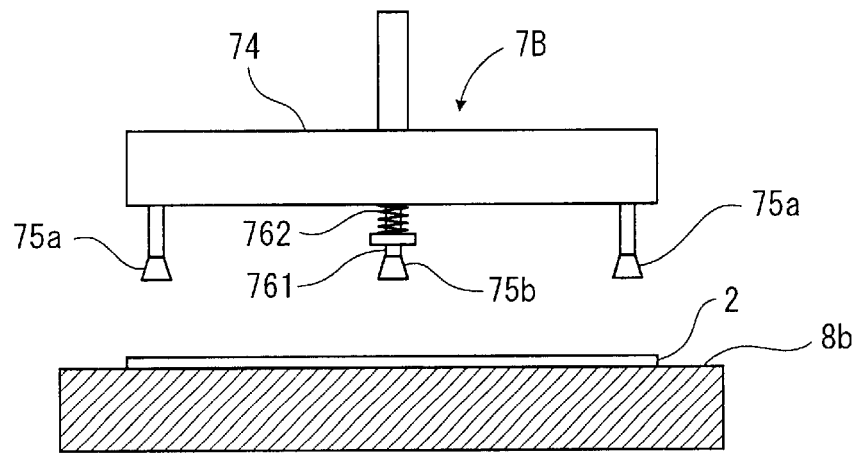
FIG. 11 is a front view showing a second adsorption unit.
Figure 12:
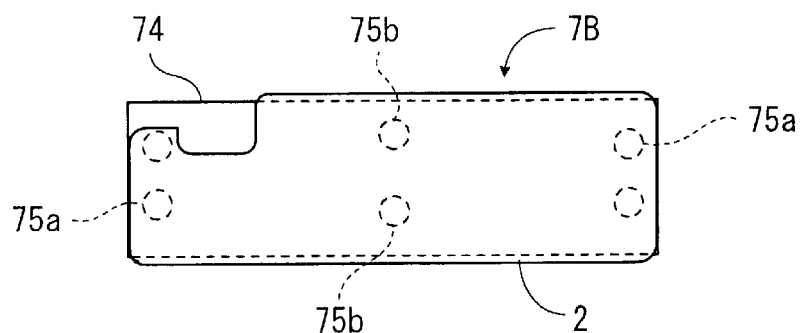
FIG. 12 is a bottom view showing the second adsorption unit with a film substrate sucked thereto.

FIG. 11 is a front view that depicts the structure of the second adsorption units 7B, and FIG. 12 is a bottom view that depicts the second adsorption units 7B with film substrates 2 attached thereto. The second adsorption units 7B are configured such that adsorption pads 75a are affixed to both edge portions in the lengthwise direction on the lower surface of a main body block 74, and adsorption pads 75b are attached to the tips of shafts 761 moveable in the vertical direction near the center of the lower surface. These adsorption pads 75a and 75b are composed of metal or synthetic resin. The shafts 761 are urged downward by the springs 762, and in a state in which no force is applied to the adsorption pads 75b, the lower edge of the adsorption pads 75b are positioned slightly lower than the lower edge of the adsorption pads 75a. It should be noted that the suction holes of the adsorption pads 75a and 75b are connected to the exhaust unit 522 and the air supply unit 512 by way of a valve in a manner similar to the first adsorption units 7A shown in FIG. 6, and suction and blowing are controlled by the main control unit 53.

Figure 13:
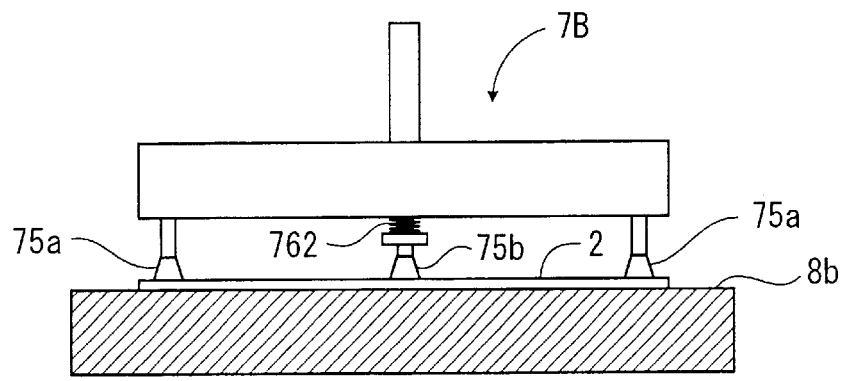
FIG. 13 is an explanatory diagram showing how the second adsorption unit receives a film substrate from the stage.
Figure 14:
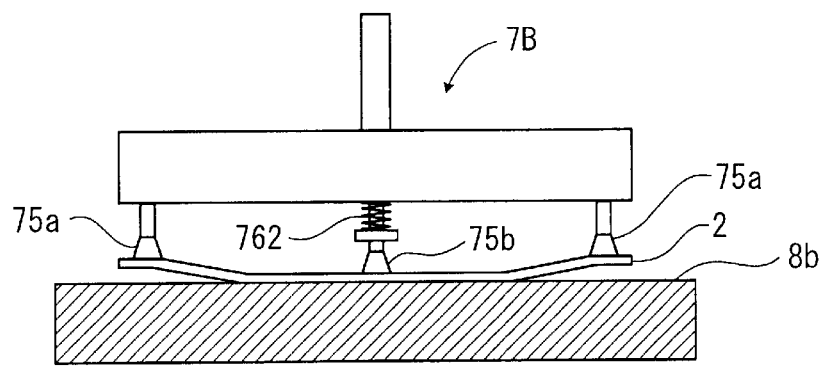
FIG. 14 is an explanatory diagram showing how the second adsorption unit receives the film substrate from the stage.
Figure 15:
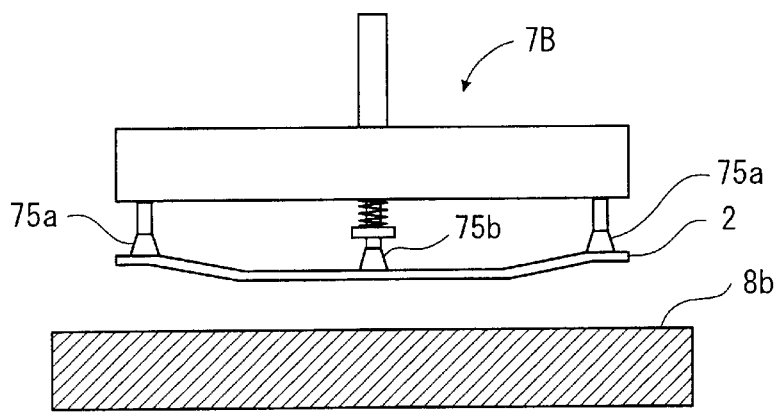
FIG. 15 is an explanatory diagram showing how the second adsorption unit receives the film substrate from the stage.
Figure 16:
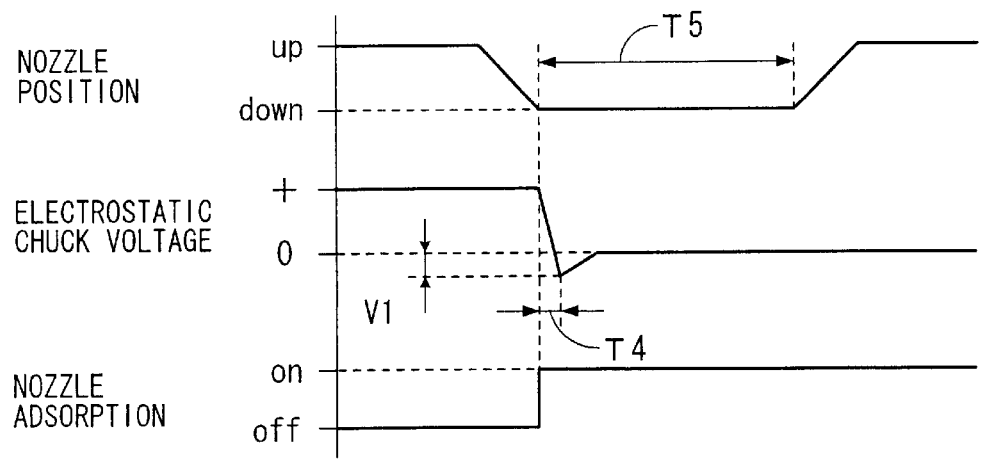
FIG. 16 is a timing chart for the process in which the second adsorption unit receives the film substrate from the stage.

FIGS. 13 to 15 are diagrams that depict the manner in which the second adsorption unit 7B receives the film substrates 2 from the stage 8b from the state shown in FIG. 11, and FIG. 16 is a timing chart depicting this process.

The second adsorption units 7B are lowered, the adsorption pads 75b come into contact with the area near the center of the film substrates 2, the springs 762 are compressed, and the adsorption pads 75a thereafter come into contact with (step S31) the edge portion area of the film substrates 2, as shown in FIG. 13.

When the second adsorption units 7B are sufficiently lowered, suction by the adsorption pads 75a and 75b is started (step S32), and the voltage for electrostatic chucking is terminated (step S33). A reverse voltage V1 (−1 kV to −2 kV) is applied in the short interval of time T4 (0.5 to 1 second) as shown in FIG. 16. The termination of the voltage is detected (step S34) based on the measured value by the voltmeter 55, and when the lower limit stable time T5 (1 second to 1.5 seconds) passes during which the position of the second adsorption units 7B are stable at the lower limit, the second adsorption units 7B are cleared from the stage 8b by the adsorption unit elevator device 7a of the transport arm device 3B.

Because the adsorption pads 75b are capable of vertical movement and are urged downward by the springs 762, the adsorption pads 75a first separate from the stage 8b, as shown in FIG. 14, and solely the edge portion of the film substrates 2 is lifted (step S35). The adsorption pads 75b then separate from the stage 8b because the second adsorption units 7B rise further, and the entirety of the film substrates 2 separate from the stage 8b, as shown in FIG. 15 (step S36).

The above transfer operation allows the film substrates 2 to be separated from the edge portion and transferred to the second adsorption units 7B without the application of excessive force even when the entirety of the film substrates 2 is in close contact with the stage 8b. Because the voltage for electrostatic chuck is terminated after providing reverse voltage to the stage 8b, the electrostatic charge of the film substrates 2 can be appropriately removed, and the force operating on the film substrates 2 can be further reduced when the film substrates 2 are separated from the stage 8b. Furthermore, because the second adsorption units 7B hold the film substrates 2 by suction, the film substrates 2 can easily be dismounted from the chambers 8 under atmospheric pressure.

The pair of second adsorption units 7B is positioned outside the chambers 8 by the arm unit drive device 6a along with the film substrates 2, and the film substrates 2 are dismounted (step S37). The second adsorption units 7B are lowered by the adsorption unit elevator device 7a, brought into contact with the film substrates 2 on the substrate dismounting slider 9 positioned in the substrate dismounting preparation position C, and positioned above after blowing from the adsorption pads 75a and 75b; and the film substrates 2 are transferred onto the substrate dismounting slider 9. The substrate dismounting slider 9 then moves to the substrate dismounting position D from the substrate dismounting preparation position C, and the treated film substrates 2 are dismounted from the film substrate treatment apparatus.

With the plasma treatment device as described above, the film substrates 2 are held by an electrostatic chuck inside the chambers 8 wherein pressure is reduced, and because holding is performed by suction outside the chambers 8, the film substrates 2 can be appropriately transported and treated. Because the first adsorption units 7A receive the film substrates 2 while pressing the film substrates 2 to the stage 8b side, an object can be closely contacted with the stage 8b (which is the electrostatic chuck) and can be held appropriately even when the object has flexibility. An object having flexibility can also be appropriately received when the second adsorption units 7B also receive the film substrates 2 from the stage 8b, because both edge portions of the film substrates 2 are lifted from the stage 8b, and the entirety of the film substrates 2 is thereafter separated from the stage 8b.

Figure 17:
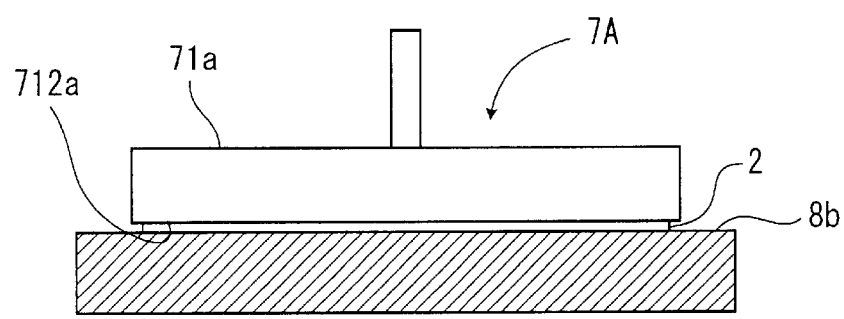
FIG. 17 is a front view showing another example of the first adsorption unit.
Figure 18:
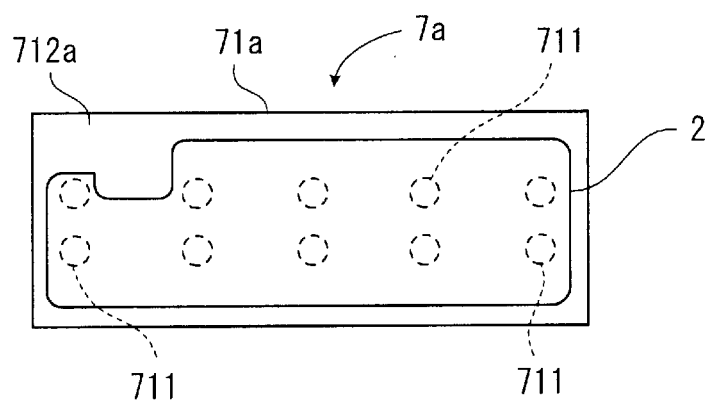
FIG. 18 is a bottom view showing another example of the first adsorption unit.

FIG. 17 is a front view that depicts another example of the first adsorption units 7A, and FIG. 18 is a bottom view that depicts the first adsorption units 7A with the film substrates 2 attached thereto. The first adsorption units 7A shown in FIGS. 17 and 18 are configured such that the bottom surface 712a of the main block 71a is a surface made flat by mirror surface machining, and has a size greater than the film substrates 2. A plurality of suction holes 711 is directly formed on the bottom surface 712a of the main block 71a. When the film substrates 2 are mounted on the stage 8b by the first adsorption units 7A, the film substrates 2 can be reliably held to the stage 8b because the bottom surface 712a of the main block 71a presses at least the entire peripheral portion of the film substrates 2 to the stage 8b.

Figure 19:
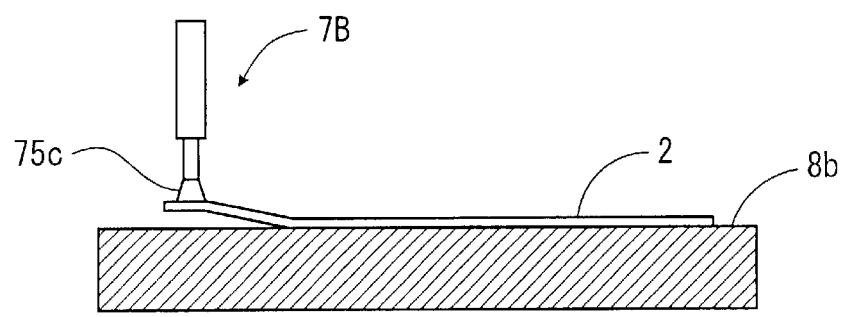
FIG. 19 is a front view showing another example of the second adsorption unit.

FIG. 19 is a front view that depicts an example of a simplified second adsorption unit 7B. The second adsorption unit 7B shown in FIG. 19 has only one adsorption pad 75c, and the adsorption pad 75c attaches by suction to the edge portion of the film substrate 2. When the second adsorption unit 7B thereby rises, the edge portion of the film substrate 2 is lifted from the stage 8b, as shown in FIG. 19, and the entire film substrate 2 is separated from the stage 8b by the further rising of the second adsorption unit 7B.

Figure 20:
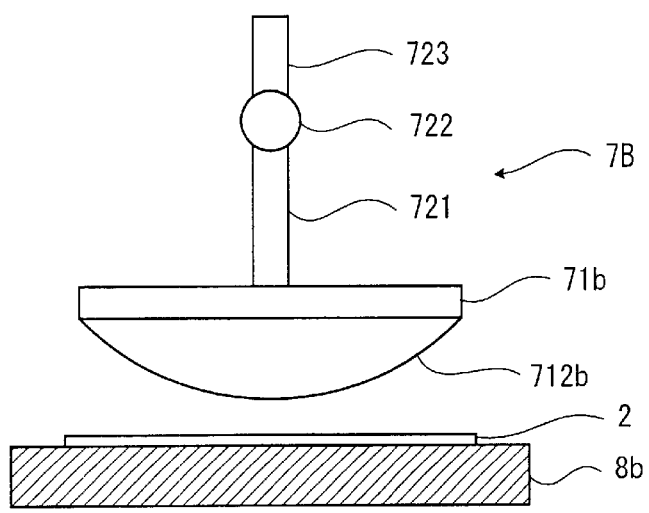
FIG. 20 is a front view showing yet another example of the second adsorption unit.
Figure 21:
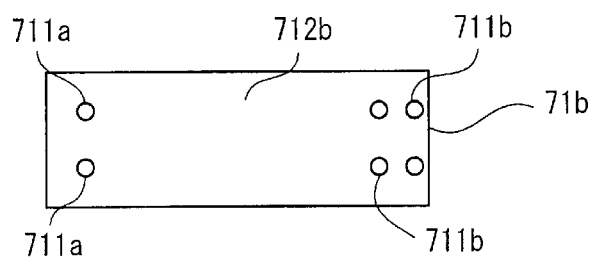
FIG. 21 is a bottom view showing yet another example of the second adsorption unit.

FIG. 20 is a front view that depicts yet another example of the second adsorption units 7B, and FIG. 21 is a bottom view. The second adsorption units 7B shown in FIGS. 20 and 21 are configured so that the bottom surface 712b of the main unit block 71*b* is a circular arc surface having a center axis (the line perpendicular to the paper surface in FIG. 20) parallel with the stage 8*b*, suction holes 711*a* are formed on one edge portion of the bottom surface 712*b*, and suction holes 711*b* are formed on the other edge portion of the bottom surface 712*b*. A rotating arm 721 is attached to the upper surface of the main unit block 71, and the rotating arm 721 is configured so as to be capable of rotating around the joint 722. The joint 722 is attached to a fixed arm 723 affixed to the arm unit 6 shown in FIG. 2. The center axis of the bottom surface (the circular arc surface) 712*b* of the main unit block 71 is positioned on the joint 722.

Figure 22:
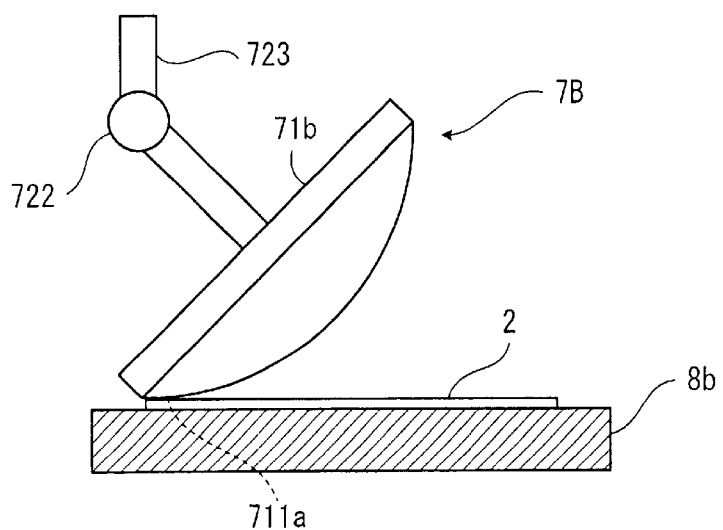
FIG. 22 is an explanatory diagram showing how the second adsorption unit receives a film substrate from the stage.

When the second adsorption units 7B receives the film substrate 2, the entire second adsorption unit 7B is lowered, the main unit block 71*b* comes into contact with the film substrate 2, and the fixed arm 723 moves toward the edge portion of the film substrate 2 (to the suction holes 711*a* side shown in FIG. 21), as shown in FIG. 22. Here, the main unit block 71*b* rotates around the joint 722, and the suction holes 711*a* and film substrate 2 make contact. It should be noted that because the joint 722 is positioned along the center axis of the bottom surface (circular arc surface) 712*b*, the fixed arm 723 need not be moved up and down.

Next, suction from the suction holes 711*a* begins in the state shown in FIG. 22, and the fixed arm 723 moves toward the other edge portion of the film substrate 2 (to the suction holes 711*b* side). The edge portion of the film substrate 2 attached by suction to the suction holes 711*a* is lifted from the stage 8*b*, and the entire film substrate 2 is then separated from the stable 8*b* along the bottom surface 712*b*, resulting in the state depicted in FIG. 23. Suction from the suction holes 711*b* is started, and the entire film substrate 2 is attached by suction to the bottom surface 712*b*.

Figure 23:
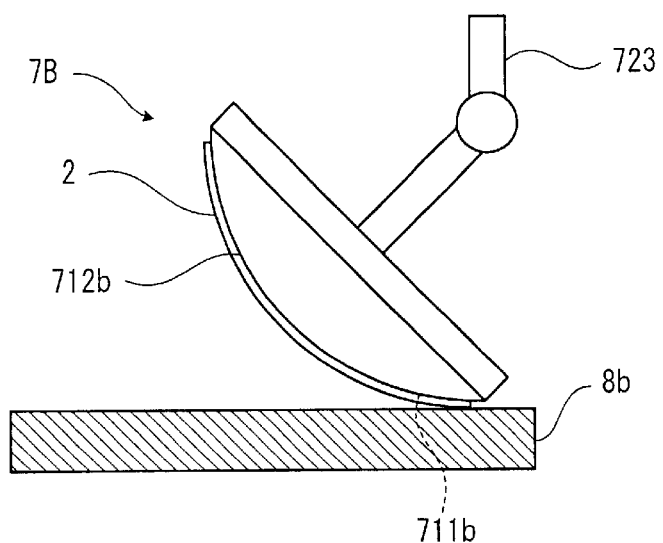
FIG. 23 is an explanatory diagram showing how the second adsorption unit receives the film substrate from the stage.
Figure 24:
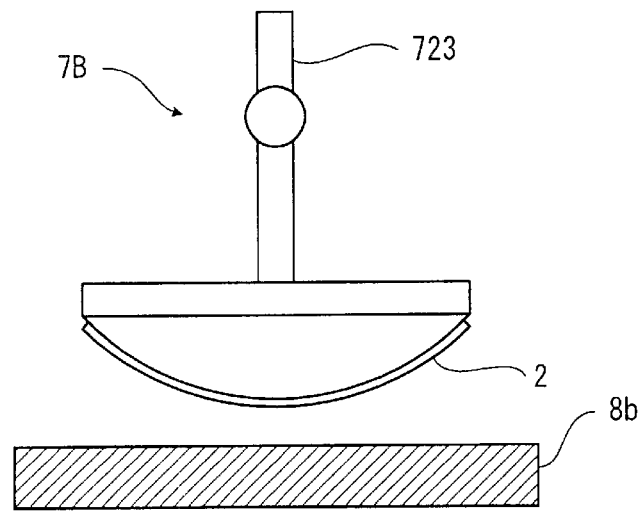
FIG. 24 is an explanatory diagram showing how the second adsorption unit receives the film substrate from the stage.

The fixed arm 723 thereafter moves horizontally to the left in FIG. 23, and at the point when the fixed arm 723 and the rotating arm 721 form a straight line, the entire film substrate 2 is separated from the stage 8*b*, as shown in FIG. 24, by the rising of the fixed arm 723, and the film substrate 2 is completely transferred to the second adsorption unit 7B.

When the film substrates 2 are transferred from the second adsorption unit 7B to the substrate dismounting slider 9 shown in FIG. 2, blowing is performed in sequence from the edge-most suction holes 711*b* to the suction holes 711*a* on the other edge in a state immediately prior to the center of the bottom surface 712*b* which is in contact with the substrate dismounting slider 9. The film substrates 2 are thereby reliably mounted in a predetermined position on the substrate dismounting slider 9 from the suction holes 711*b* side without being affected by the blowing. Blowing may be simultaneously performed from all the suction holes 711*a* and 711*b* in a state whereby the center of the bottom surface 712*b* of the second adsorption unit 7B comes into contact with the substrate dismounting slider 9, sandwiching the film substrate 2.

Figure 25:
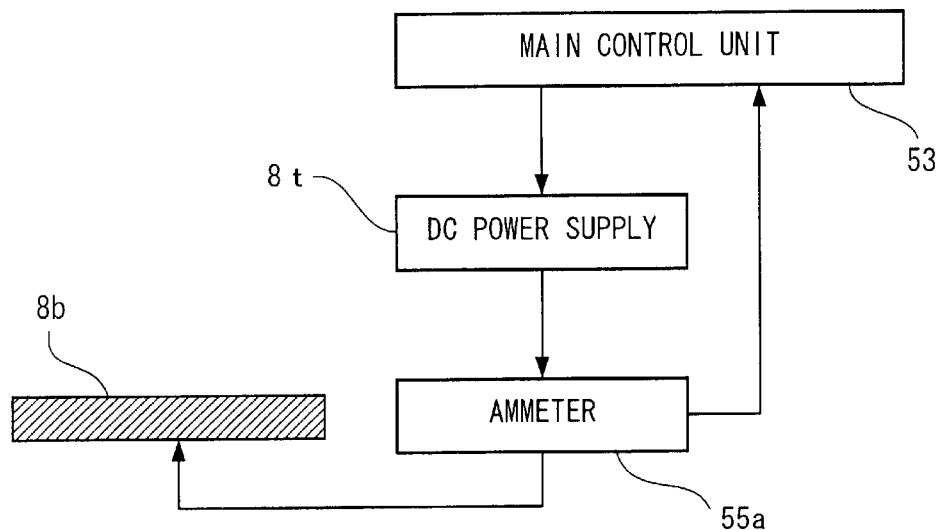
FIG. 25 is an explanatory diagram showing a state in which an ammeter is used in lieu of a voltmeter depicted in FIG. 6.
Figure 26:
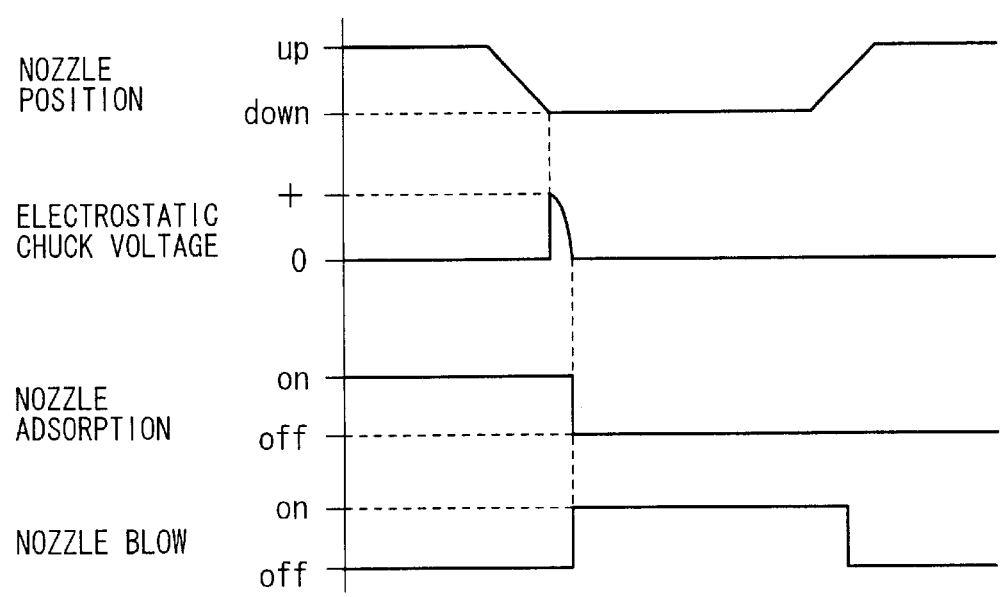
FIG. 26 is a timing chart for the process in which a film substrate is transferred from the first adsorption unit to the stage.

FIG. 25 is a diagram that depicts a state in which an ammeter 55*a* is used in lieu of the voltmeter 55 depicted in FIG. 6, and FIG. 26 is a timing chart for the process in which the film substrates 2 are transferred from the first adsorption unit 7A to the stage 8*b*.

In the case that an ammeter 55*a* is used, current temporarily (0.1 to 0.2 seconds) flows toward the stage 8*b*, as shown in FIG. 26, when the first adsorption units 7A are lowered and the DC power supply 8*t* is switched on. The ammeter 55*a* measures this current and inputs it to the main control unit 53. After the current value is detected to have sufficiently declined, the main control unit 53 releases adsorption by the first adsorption units 7A and initiates blowing. In other words, in the step S14 shown in FIG. 4, current is checked in lieu of voltage, and holding by the stage 8*b* can thereby be appropriately performed.

It is possible to measure both voltage and current instead of measuring current in lieu of measuring voltage. In this case, transfer timing can be more appropriately performed using voltage and current, and abnormalities can be detected in cases in which these abnormalities affect either voltage or current alone.

The embodiments of the present invention have been described above, but the present invention is not limited to the embodiments described above, and may take various forms.

For example, the structure of the first adsorption units 7A and the second adsorption units 7B may be modified as necessary as long as the structure has equivalent functions. The first adsorption units 7A may be configured such that the mutually opposing edge portion areas of the film substrates 2 and the other areas are urged toward the stage 8*b*, and other configurations of the second adsorption units 7B may also be adopted whereby the edge portions of the film substrates 2 are lifted and the entire object is thereafter separated from the stage 8*b*. The film substrates 2 may also be held by methods other than suction.

The treatment performed on the film substrates 2 in the chambers 8 is not limited to treatment by plasma and may also include treatment by electron beam, ultraviolet radiation, fast atomic beam, or other processes.

What is claimed is:

1. A film substrate treatment apparatus, comprising:
    a stage for holding a rear surface of a film substrate by electrostatic force, the reverse face being opposite to a to-be-treated surface of the film substrate;
    a chamber for accommodating the stage in an interior thereof;
    a treatment unit for performing a predetermined treatment on the to-be-treated surface of the film substrate held by the stage, with the interior of the chamber in a decompressed state; and
    a transport unit for transporting the film substrate while holding the to-be-treated surface thereof, and mounting the film substrate on the stage while pressing the to-be-treated surface thereof against the stage.

2. The film substrate treatment apparatus according to claim 1, wherein the transport unit has a carrying-in holding unit for holding the film substrate by suction.

3. The film substrate treatment apparatus according to claim 1, wherein the carrying-in holding unit has a pressing member for pressing at least an edge portion area of the film substrate against the stage.

4. The film substrate treatment apparatus according to claim 1, wherein the carrying-in holding unit has a surface for pressing an entire peripheral portion of the film substrate against the stage.

5. A film substrate treatment method, comprising:
    a transport step for transporting a film substrate while holding a to-be-treated surface thereof by a carrying-in holding unit;
    a mounting step for mounting the film substrate on a stage while pressing the to-be-treated surface thereof against the stage by the carrying-in holding unit;
    a stage holding step for holding a rear surface of the film substrate on the stage by electrostatic force, the rear surface being opposite to the to-be-treated surface;

a decompressing step for reducing pressure in an area surrounding the stage; and a treatment step for performing a predetermined treatment on the to-be-treated surface of the film substrate.

6. The film substrate treatment method according to claim 5, wherein the carrying-in holding unit presses at least the edge portion area of the film substrate against the stage in the mounting step.

7. The film substrate treatment method according to claim 5, wherein the carrying-in holding unit presses the entire peripheral portion of the film substrate against the stage in the mounting step.

8. The film substrate treatment method according to claim 5, wherein the stage holding step comprises a step for applying voltage to the stage, and a step for releasing the hold of the film substrate by the carrying-in holding unit after changing the voltage.

9. The film substrate treatment method according to claim 5, wherein the stage holding step comprises a step for applying voltage to the stage, a current detecting step for detecting current to the stage and detecting a drop in current after applying the voltage, and a releasing step for releasing the hold of the film substrate by the carrying-in holding unit after detecting a drop in the current.

10. A film substrate treatment apparatus having a carrying-out holding unit for dismounting a film substrate from a stage holding the film substrate thereon by electrostatic force, the carrying-out holding unit comprising:

an edge lifting unit for holding and lifting an edge of the film substrate from the stage, and an complete separation unit for holding other parts of the film substrate and separating the entire film substrate from the stage.

11. The film substrate treatment apparatus according to claim 10, wherein the edge lifting unit comes into contact with the film substrate and is a part of a circular arc surface for sucking, and the complete separation unit is another part of the circular arc surface.

12. A film substrate dismounting method for dismounting a film substrate from a stage for holding the film substrate, comprising:

a holding step in which an edge lifting unit holds an edge of the film substrate on the stage, and a complete separation unit holds other parts;

an edge lifting step in which the edge lifting unit lifts the edge of the film substrate from the stage by providing a clearance from the stage; and a complete separation step in which the complete separation unit completely separates the entire film substrate from the stage by providing a clearance from the stage.

13. The film substrate dismounting method according to claim 12, wherein the stage holds the film substrate by electrostatic force, and the method further comprises a voltage terminating step for terminating voltage applied to the stage, before the edge portion lifting step, and a voltage detection step for detecting change in voltage of the stage.

14. The film substrate dismounting method according to claim 13, further comprising a reverse voltage applying step for providing reverse voltage to the stage, before the voltage terminating step.

15. A film substrate treatment apparatus comprising:

a transport unit for transporting a film substrate;

a stage for holding a rear surface of the film substrate by electrostatic force, the rear surface being opposite to a to-be-treated surface of the film substrate;

a chamber for accommodating the stage in an interior thereof; and a treatment unit for performing a predetermined treatment on the treated surface of the film substrate held by the stage, with the interior of the chamber in a decompressed state, wherein the transport unit comprises:

a carrying-in holding unit for holding and transporting the film substrate, and mounting the film substrate on the stage while pressing the to-be-treated surface of the film substrate; and a carrying-out holding unit for dismounting the film substrate from the stage holding the film substrate by electrostatic force.

16. The film substrate treatment apparatus according to claim 15, wherein the carring-out holding unit holds the film substrate by suction, and presses the edge portion area of the film substrate against the stage.

17. The film substrate treatment apparatus according to claim 15, wherein the carrying-out holding unit first holds the edge portion of the substrate and thereafter lifts the entire film substrate from the stage.

* * * * *